(12) United States Patent
Masliah et al.

(10) Patent No.: US 7,863,645 B2
(45) Date of Patent: Jan. 4, 2011

(54) HIGH BREAKDOWN VOLTAGE DOUBLE-GATE SEMICONDUCTOR DEVICE

(75) Inventors: Denis A. Masliah, St-Germain en Laye (FR); Alexandre G. Bracale, Paris (FR); Francis C. Huin, Soullans (FR); Patrice J. Barroul, Bois d'Arcy (FR)

(73) Assignee: ACCO Semiconductor Inc., Sunnyvale, CA (US)

( * ) Notice: Subject to any disclaimer, the term of this patent is extended or adjusted under 35 U.S.C. 154(b) by 378 days.

(21) Appl. No.: 12/070,019

(22) Filed: Feb. 13, 2008

(65) Prior Publication Data

US 2009/0200581 A1 Aug. 13, 2009

(51) Int. Cl.
*H01L 29/02* (2006.01)

(52) U.S. Cl. .................. 257/168; 257/129; 257/272; 257/E29.008

(58) Field of Classification Search ............. 257/129, 257/133, 168, 270, 272, 274, E29.312, E29.008
See application file for complete search history.

(56) References Cited

U.S. PATENT DOCUMENTS

| | | | |
|---|---|---|---|
| 4,255,714 A | 3/1981 | Rosen | |
| 4,523,111 A | 6/1985 | Baliga | |
| 4,811,075 A | 3/1989 | Eklund | |
| 5,061,903 A | 10/1991 | Vasile | |
| 5,126,807 A | 6/1992 | Baba et al. | |
| 5,559,049 A | 9/1996 | Cho | |
| 5,677,927 A | 10/1997 | Fullerton et al. | |
| 5,898,198 A | 4/1999 | Hebert et al. | |

(Continued)

FOREIGN PATENT DOCUMENTS

EP 2006009009 1/1996

(Continued)

OTHER PUBLICATIONS

Gautier, D., et al., "Improved Delta Sigma Modulators for High Speed Applications," Acco Semiconductors, Mar. 25, 2009.

(Continued)

*Primary Examiner*—Asok K Sarkar
*Assistant Examiner*—Julia Slutsker
(74) *Attorney, Agent, or Firm*—Peters Verny, LLP

(57) ABSTRACT

A double-gate semiconductor device provides a high breakdown voltage allowing for a large excursion of the output voltage that is useful for power applications. The double-gate semiconductor device may be considered a double-gate device including a MOS gate and a junction gate, in which the bias of the junction gate may be a function of the gate voltage of the MOS gate. The breakdown voltage of the double-gate semiconductor device is the sum of the breakdown voltages of the MOS gate and the junction gate. Because an individual junction gate has an intrinsically high breakdown voltage, the breakdown voltage of the double-gate semiconductor device is greater than the breakdown voltage of an individual MOS gate. The double-gate semiconductor device provides improved RF capability in addition to operability at higher power levels as compared to conventional transistor devices. The double-gate semiconductor device may also be fabricated in a higher spatial density configuration such that a common implantation between the MOS gate and the junction gate is eliminated.

6 Claims, 6 Drawing Sheets

U.S. PATENT DOCUMENTS

| | | | |
|---|---|---|---|
| 5,912,490 | A | 6/1999 | Hebert et al. |
| 5,969,582 | A | 10/1999 | Boesch et al. |
| 6,061,008 | A | 5/2000 | Abbey |
| 6,061,555 | A | 5/2000 | Bultman et al. |
| 6,088,484 | A | 7/2000 | Mead |
| 6,275,177 | B1 | 8/2001 | Ho et al. |
| 6,300,835 | B1 | 10/2001 | Seely et al. |
| 6,570,518 | B2 | 5/2003 | Riley et al. |
| 6,633,195 | B2 | 10/2003 | Baudelot et al. |
| 6,703,684 | B2 | 3/2004 | Udrea et al. |
| 7,049,669 | B2 | 5/2006 | Ma et al. |
| 7,162,042 | B2 | 1/2007 | Spencer et al. |
| 7,312,481 | B2 | 12/2007 | Chen et al. |
| 7,808,415 | B1 | 10/2010 | Robbe et al. |
| 2002/0093442 | A1 | 7/2002 | Gupta |
| 2003/0227034 | A1* | 12/2003 | Davis .................... 257/256 |
| 2005/0287966 | A1 | 12/2005 | Yoshimi et al. |
| 2006/0228850 | A1 | 10/2006 | Tsai et al. |
| 2007/0018865 | A1 | 1/2007 | Chang et al. |
| 2008/0031382 | A1 | 2/2008 | Aoki |
| 2008/0291069 | A1 | 11/2008 | Inukai et al. |
| 2009/0066549 | A1 | 3/2009 | Thomsen et al. |

FOREIGN PATENT DOCUMENTS

| | | |
|---|---|---|
| WO | 9956311 | 11/1999 |
| WO | 0139451 | 5/2001 |
| WO | 2006054148 | 5/2006 |
| WO | WO2006054148 | 5/2006 |
| WO | 2007042850 | 4/2007 |
| WO | WO2007042850 | 4/2007 |

OTHER PUBLICATIONS

Azakkour, A. et al., "Challenges for a new integrated Ultra-wideband (UWB) source," IEEE, 2003 pp. 433-437.

Azakkour, A. et al., "A new integrated moncycle generator and transmitter for Ultra-wideband (UWB) communications," IEEE Radio Frequency Circuits Symposium, 2005 pp. 79-82.

Choi, Y. H. et al., "Gated UWB Pulse Signal Generation," IEEE, 2004 pp. 122-124.

PCT/US2008/001938 Int'l Search Report, Jun. 26, 2008.

PCT/IB05/003426 Int'l Search Report, Mar. 20, 2006.

PCT/IB05/003426 Written Opinion, May 16, 2007.

PCT/IB05/003029 Int'l Search Report, Jul. 6, 2006.

PCT/IB05/003029 Written Opinion, Mar. 12, 2008.

PCT/US10/27921 Int'l Search Report and Written Opinion, May 10, 2010.

PCT/US10/30770 Int'l Search Report and Written Opinion, Jun. 16, 2010.

Vaes, H. M. J. et al., "High Voltage, High Current Lateral Devices," IEDM Technical Digest, 1988, pp. 87-90.

Pocha, Michael D. et al. "Threshold Voltage Controllability in Doulbe-Diffused MOS Transistors," IEEE Transactions on Electronic Devices, vol. ED-21, No. 12, Dec. 1994.

PCT/US08/01938 Int'l Preliminary Report on Patentability, Aug. 17, 2010.

PCT/US10/41985 Int'l Search Report and Written Opinion, Sep. 9, 2010.

* cited by examiner

HIGH BREAKDOWN VOLTAGE DOUBLE-GATE SEMICONDUCTOR DEVICE

BACKGROUND

1. Field of Invention

The present invention relates generally to semiconductor devices. More particularly, the present invention relates to a semiconductor device configured for power applications.

2. Related Art

Complementary metal-oxide semiconductor (CMOS) devices designed for radio-frequency (RF) power applications have traditionally required a tradeoff between improved RF performance versus a higher breakdown voltage. For example, the RF performance of a CMOS device may be improved by reducing gate geometries (e.g., by using short channel lengths). Smaller gate geometries, however, reduce the breakdown voltage of the CMOS device. Because the reduced breakdown voltage limits the voltage swing available at the output of a CMOS device in an amplifier configuration, such CMOS devices are less useful in power applications.

In one approach to the breakdown voltage problem, CMOS devices may be designed for greater current drive with a lower voltage swing. Greater current drive may, however, require the width of a transistor in the CMOS device to be made large thus presenting an undesired capacitive load to the driving circuit.

Another approach to the breakdown voltage problem uses Laterally Diffused Metal-Oxide-Semiconductor (LDMOS) transistors. LDMOS transistors have a drift region between an active region and a drain. The drift region is lightly doped and experiences the largest voltage swings. Because the doping concentration in the drift region is limited by the breakdown voltage requirements, LDMOS devices tradeoff a higher breakdown voltage for a higher total resistance of the drain-current flowing from the drain to the source terminals (known as the on-state resistance).

Another approach to the breakdown voltage problem uses devices with thicker and higher resistivity substrates. These devices may offer higher-voltage performance but also introduce higher on-state losses. These devices include Reduced Surface Field (RESURF) devices in which the depletion region of the substrate diode interacts with the depletion region of the lateral diode to reduce the surface field. In these devices, the voltage breakdown is increased because of the lateral widening of the depletion zone.

There is, therefore, a need for a high breakdown voltage semiconductor device that provides improved RF capability and higher power as compared to conventional semiconductor devices.

SUMMARY

Embodiments of the invention include a method for controlling a high-breakdown voltage double-gate semiconductor device. The method includes forming a high-breakdown voltage double-gate semiconductor device including a metal-oxide-semiconductor gate on a substrate, and a junction gate substantially in a well region, the well region substantially in the substrate. The method further includes forming a drain substantially in the well region, forming a source substantially in the substrate, and coupling control circuitry to the junction gate, the control circuitry configured to control a current flowing between the drain and the source by changing an effective resistance of the junction gate.

According to another embodiment of the invention, a method includes controlling a high-breakdown voltage double-gate semiconductor device by forming a substrate having a first doping type, forming a source substantially in the substrate, the source having a second doping type, forming a first gate on an oxide layer disposed on the substrate, forming a well region substantially in the substrate and having a second doping type, forming a second gate substantially in the well region, the second gate having a first doping type, and forming a drain substantially in the well region, the drain having a second doping type. The method further includes coupling control circuitry to the second gate, the control circuitry configured to control the high-breakdown voltage double-gate semiconductor device by changing an effective resistance between the drain in the well region and the source, wherein the effective resistance controls a current flowing between the drain in the well region and the source.

Embodiments of the invention include a high-breakdown voltage double-gate semiconductor device for power applications including a substrate having a first doping type, a source formed substantially in the substrate, the source having a second doping type, a first gate formed on an oxide layer disposed on the substrate, a well region having a second conductivity type and formed substantially in the substrate, and a drain formed substantially in the well region, the drain having a second doping type. The embodiment of the invention further includes a second gate formed substantially in the well region, the second gate having a first doping type, wherein a current flowing in high-breakdown voltage double-gate semiconductor device is responsive to a voltage applied to the second gate.

BRIEF DESCRIPTION OF THE DRAWINGS

Elements in the figures are illustrated for simplicity and clarity and are not drawn to scale. The dimensions of some of the elements may be exaggerated relative to other elements to help improve the understanding of various embodiments of the invention.

DETAILED DESCRIPTION

A double-gate semiconductor device provides a high breakdown voltage allowing for a large excursion of the output voltage that is useful for power applications. The double-gate semiconductor device may be considered a double-gate device including a metal-oxide-semiconductor (MOS) gate and a junction gate, in which the bias of the junction gate may be a function of the gate voltage of the MOS gate. The breakdown voltage of the double-gate semiconductor device is the sum of the breakdown voltages of the MOS gate and the junction gate. Because an individual junction gate has an intrinsically high breakdown voltage, the breakdown voltage of the double-gate semiconductor device is higher than the breakdown voltage of an individual MOS gate.

The double-gate semiconductor device provides improved RF capability in addition to operability at higher power levels as compared to conventional complementary metal-oxide semiconductor (CMOS) devices. The double-gate semiconductor device may be fabricated substantially on and/or in a substrate using techniques of semiconductor fabrication known in the art and may use standard fabrication processes for CMOS and logic devices with minor modifications in the process flow.

A MOS gate may include a metal-oxide-semiconductor structure that, when a voltage is applied to the MOS gate, modifies the charge distribution in a semiconductor structure, thus controlling the conductive characteristics of the semiconductor structure. The MOS gate can thus function as an electrically-controlled gate or switch. This type of gate may be found in a metal-oxide-semiconductor field effect transistor (MOSFET) device. A junction gate includes a region of a channel of semiconductor material that has doping characteristics that are opposite that of the rest of the channel such that when a voltage is applied to the junction gate the charge distribution in the channel is modified and thereby controls the conductive characteristics of the channel. The junction gate can thus function as an electrically-controlled gate or switch. This type of gate may be found in a junction field effect transistor (JFET). The effective resistance of the junction gate is the resistance of the channel as controlled by the voltage of the junction gate.

The double-gate semiconductor device may be fabricated including one or more implantation regions between the MOS gate and the junction gate. Embodiments without an implantation region between the MOS gate and the junction gate may provide a higher spatial density configuration for the double-gate semiconductor device than embodiments that include one or more implantation regions between the MOS gate and the junction gate. The principles of operation of these various embodiments are similar, except that a depletion region between the MOS gate channel and a drift region is modified.

Figure 1:
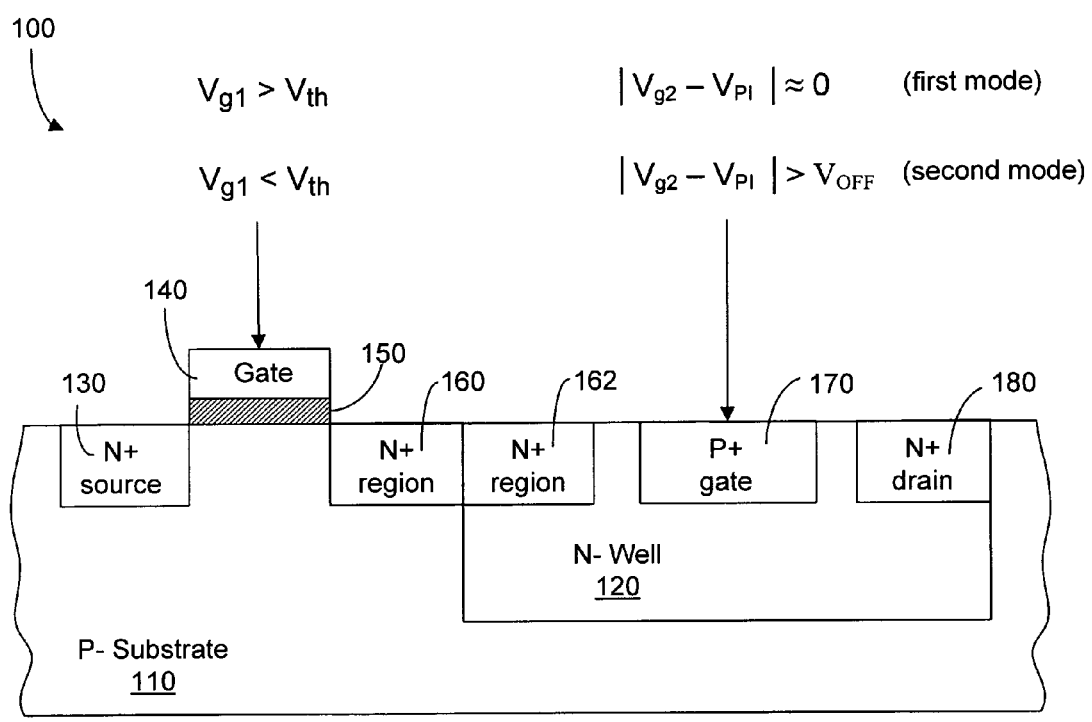
FIG. 1 illustrates an exemplary cross section of a double-gate semiconductor device comprising a MOS gate, a junction gate and two adjacent N+ regions.

FIG. 1 illustrates an exemplary cross section of a double-gate semiconductor device comprising a MOS gate, a junction gate and two adjacent N+ regions (i.e., implantation regions). Double-gate semiconductor device 100 may be formed from regions and/or layers of doped silicon, polysilicon, metal, and insulating layers using semiconductor fabrication techniques known in the art. Double-gate semiconductor device 100 comprises P− substrate 110, a N− well 120 formed in the P− substrate 110, N+ source 130, gate 140, oxide layer 150, N+ region 160, N+ region 162, P+ gate 170, and N+ drain 180. As used herein, the "+" symbol indicates strong doping of the conductivity type indicated (e.g., N+ indicatingeN type, strong doping) and the "−" symbol indicates weak doping of the conductivity type indicated (e.g., P− indicating P type, weak doping).

Electrical signals, such as $V_{g1}$ and control voltage $V_{g2}$, may be coupled to gate 140 and P+ gate 170, respectively. Electrical signals may also be coupled to N+ source 130, N+ region 160, N+ region 162 and N+ drain 180 using additional polysilicon layers (not shown) or metal layers (not shown) disposed on a surface of each of the N+ source 130, N+ region 160, N+ region 162 and N+ drain 180 using semiconductor fabrication techniques known in the art.

Double-gate semiconductor device 100 includes an N-type MOS Field Effect Transistor (also known as a N-channel MOSFET) formed by P− substrate 110, N+ source 130, and N+ region 160, gate 140, and oxide layer 150. The double-gate semiconductor device 100 also includes an N-channel Junction Field Effect Transistor (also known as an N-type JFET) formed by P− substrate 110, N− well 120, N+ region 162, P+ gate 170 and N+ drain 180. In this embodiment, N+ region 160 and N+ region 162 are adjacent and N+ region 162 is disposed substantially in N− well 120.

Alternatively, the elements of the double-gate semiconductor device 100 may be configured so that the double-gate semiconductor device 100 comprises a P-type MOS gate including a P-channel junction gate. In such an embodiment, some of the regions and/or layers of doped silicon may have a different doping, according to semiconductor fabrication techniques known in the art.

The double-gate semiconductor device 100 may be considered to operate in two modes. A first mode, illustrated in FIG. 1, is indicated by $V_{g1}$>a threshold voltage $V_{th}$ and $|V_{g2}-V_{PI}|\approx 0$ (i.e., the absolute value of $V_{g2}-V_{PI}$ is approximately 0). $V_{g1}$ is a voltage at the gate 140, $V_{g2}$ is a voltage at the P+ gate 170, $V_{th}$ is a threshold voltage for the gate 140, and $V_{PI}$ is a voltage at N+ region 162. In the first mode a voltage $V_{g1}$ is applied to gate 140 that is greater than $V_{th}$ so that the MOS gate is "on." A control voltage $V_{g2}$ is applied to P+ gate 170 so that the junction gate is biased with a low potential difference between control voltage $V_{g2}$ and a voltage $V_{PI}$ of the N+ region 162. The P+ gate 170 thus presents a low resistance, $R_{on}$, to the current flow. In the first mode, the semiconductor device 100 conducts a current between N+ source 130 and N+ drain 180. In the second mode, the semiconductor device 100 does not conduct the current.

Returning to FIG. 1, in the second mode a negative control voltage $V_{g2}$ is applied to P+ gate 170 and the depletion region under P+ gate 170 extends into a channel (not shown) in N− well 120. When the control voltage $V_{g2}$ applied to P+ gate 170 is such that $|V_{g2}-V_{PI}|$ is greater than a pinch off voltage, $V_{off}$, the channel is fully depleted under the P+ gate 170 and no current flows between the N+ region 162 and N+ drain 180. Likewise, in the second mode, no current flows between N+ source 130 and N+ drain 180.

When a control voltage $V_{g2}$ is applied to P+ gate 170 such that $|V_{g2}-V_{PI}|\approx 0$ (corresponding to the first mode), the channel is open and a current of majority carriers may flow between N+ region 162 and N+ drain 180. The P+ gate 170 (the junction gate) may, therefore, behave equivalently to a variable resistor with a high effective resistance, $R_{off}$, that allows little or no current flow between N+ source 130 and N+ drain 180 when $|V_{g2}-V_{PI}|>V_{off}$, and a low effective resistance, $R_{on}$, allowing maximum current flow when $|V_{g2}-V_{PI}|\approx 0$.

The double-gate semiconductor device 100 may include a device with a double gate in which the control voltage $V_{g2}$ at P+ gate 170 (the junction gate) may be a function of the voltage $V_{g1}$ at gate 140 (the MOS gate). The MOS gate and the junction gate may both be dynamically biased in the "on" state or "off" state at the same time using a control circuitry described with reference to FIG. 5.

The high effective resistance, $R_{off}$, in the second mode of operation allows the P+ gate 170 to sustain a high voltage and limits the voltage potential between gate 140 and N+ region 160 to less than the MOS gate breakdown voltage. Because the breakdown voltage of the double-gate semiconductor device 100 is the sum of the breakdown voltages of the MOS gate and the P+ gate 170, the intrinsically high breakdown voltage of the P+ gate 170 provides the high breakdown voltage of the double-gate semiconductor device 100.

The control voltage $V_{g2}$ may be adjusted using the control circuitry and may depend on the pinch-off voltage, $V_{off}$. The control circuitry may comprise a capacitor (not shown) configured to couple a RF signal from gate 140 to P+ gate 170. To limit the distance between gate 140 and P+ gate 170, the capacitor may be implemented with multiple stacked metal layers in parallel between the gate 140 and P+ gate 170.

Figure 2:
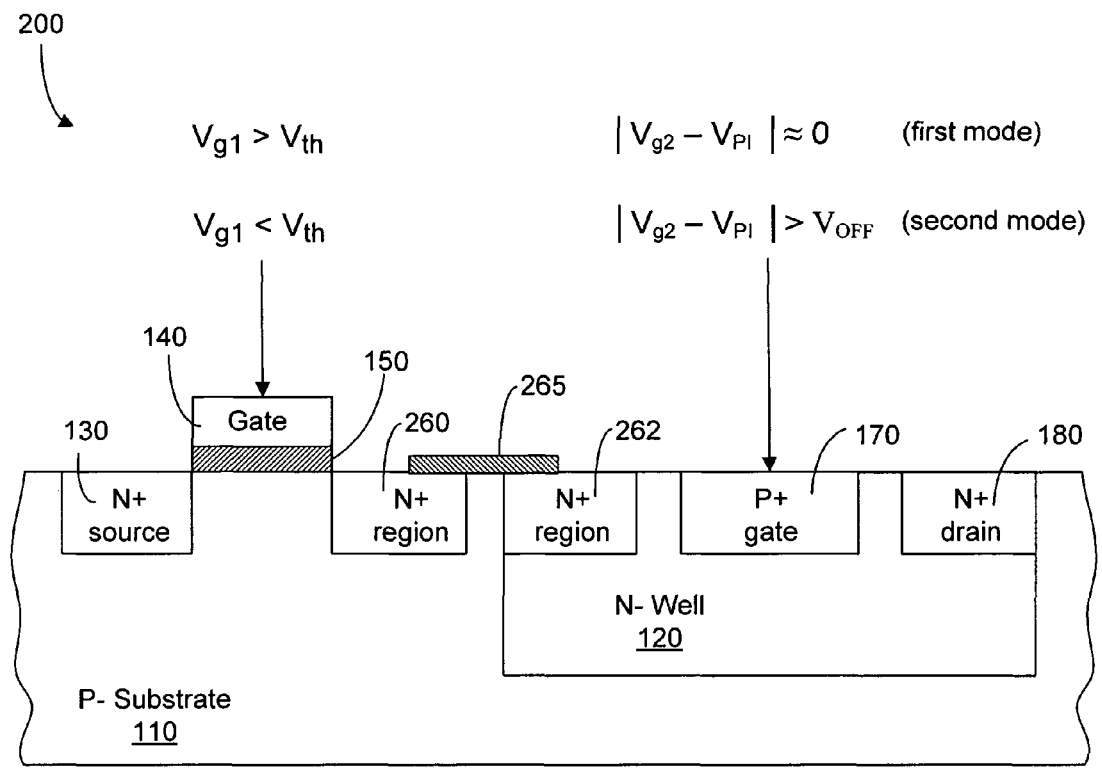
FIG. 2 illustrates an exemplary cross section of a double-gate semiconductor device comprising a MOS gate, a junction gate and two N+ regions coupled using a conducting layer.

FIG. 2 illustrates an exemplary cross section of a double-gate semiconductor device comprising a MOS gate, a junction gate and two N+ regions coupled using a conducting layer. Double-gate semiconductor device 200 may be formed from regions and/or layers of doped silicon, polysilicon, metal, and insulating layers using semiconductor fabrication techniques known in the art.

Double-gate semiconductor device 200 comprises P− substrate 110, a N− well 120 formed in the P− substrate 110, N+ source 130, gate 140, oxide layer 150, N+ region 260, N+ region 262, conducting layer 265, P+ gate 170, and N+ drain 180. Conducting layer 265 may be a polysilicon layer, a metal layer or another conducting layer known in the art. As illustrated in FIG. 2, N+ region 260 and N+ region 262 are separated by a region of P− substrate 110, and N+ region 262 is disposed substantially in N− well 120.

As discussed herein with respect to double-gate semiconductor device 200, electrical signals, such as $V_{g1}$ and control voltage $V_{g2}$, may be coupled to gate 140 and P+ gate 170, respectively. Electrical signals may also be coupled to N+ source 130, N+ region 260, N+ region 262 and N+ drain 180 using additional polysilicon layers (not shown) or metal layers (not shown) disposed on a surface of each of the N+ source 130, N+ region 260, N+ region 262 and N+ drain 180 using semiconductor fabrication techniques known in the art.

Double-gate semiconductor device 200 includes an N-type MOSFET formed by P− substrate 110, N− well 120, N+ source 130, and N+ region 260, gate 140, and oxide layer 150. The double-gate semiconductor device 200 also includes an N-channel JFET formed by P− substrate 110, N− well 120, N+ region 262, P+ gate 170 and N+ drain 180. In this embodiment, N+ region 260 and N+ region 262 are coupled using conducting layer 265.

Alternatively, the elements of the double-gate semiconductor device 200 may be configured so that the double-gate semiconductor device 200 comprises a P-type MOS gate including a P-channel junction gate or an N-type MOS gate including a P-channel junction gate or a P-type MOS gate including a N-channel junction gate. In such an embodiment, some of the regions and/or layers of doped silicon may have a different doping, according to semiconductor fabrication techniques known in the art.

The double-gate semiconductor device 200 may be considered to operate analogously to the two modes as described herein with respect to FIG. 1. A first mode is indicated by $V_{g1}>$a threshold voltage $V_{th}$ and $|V_{g2}-V_{PI}|\approx 0$, where $V_{PI}$ is a voltage at N+ region 262. In the first mode, a voltage $V_{g1}$ is applied to gate 140 that is greater than $V_{th}$ so that the MOS gate is "on." A control voltage $V_{g2}$ is applied to P+ gate 170 so that the junction gate is biased with a low potential difference between control voltage $V_{g2}$ and a voltage $V_{PI}$ of the N+ region 262. The P+ gate 170 thus presents a low resistance, $R_{on}$, to the current flow. In the first mode, the semiconductor device 200 conducts a current between N+ source 130 and N+ drain 180. In the second mode, the semiconductor device 200 does not conduct the current.

When a control voltage $V_{g2}$ is applied to P+ gate 170 such that $|V_{g2}-V_{PI}|\approx 0$ (corresponding to the first mode), the channel is open and a current of majority carriers may flow between N+ region 262 and N+ drain 180. The P+ gate 170 (the junction gate) may, therefore, behave equivalently to a variable resistor with a high effective resistance, $R_{off}$, that allows little or no current flow between N+ source 130 and N+ drain 180 when $|V_{g2}-V_{PI}|>V_{off}$, and a low effective resistance, $R_{on}$, allowing maximum current flow when $|V_{g2}-V_{PI}|\approx 0$.

The double-gate semiconductor device 200 may include a device with a double-gate in which the control voltage $V_{g2}$ at P+ gate 170, the junction gate, may be a function of the voltage $V_{g1}$ at gate 140. The MOS gate and the junction gate may both be dynamically biased in the "on" state or "off" state at the same time using a control circuitry described with reference to FIG. 5. The control circuitry may include a capacitor (not shown) configured to couple a RF signal from gate 140 to P+ gate 170, as described with reference to FIG. 1.

In the second mode of operation, the high effective resistance, $R_{off}$, allows the P+ gate 170 to sustain a high voltage and limits the voltage potential between gate 140 and N+ region 260 to less than the MOS gate breakdown voltage. Because the breakdown voltage of the double-gate semiconductor device 200 is the sum of the breakdown voltages of the MOS gate and the P+ gate 170, the intrinsically high breakdown voltage of the P+ gate 170 provides the high breakdown voltage of the double-gate semiconductor device 200.

Figure 3:
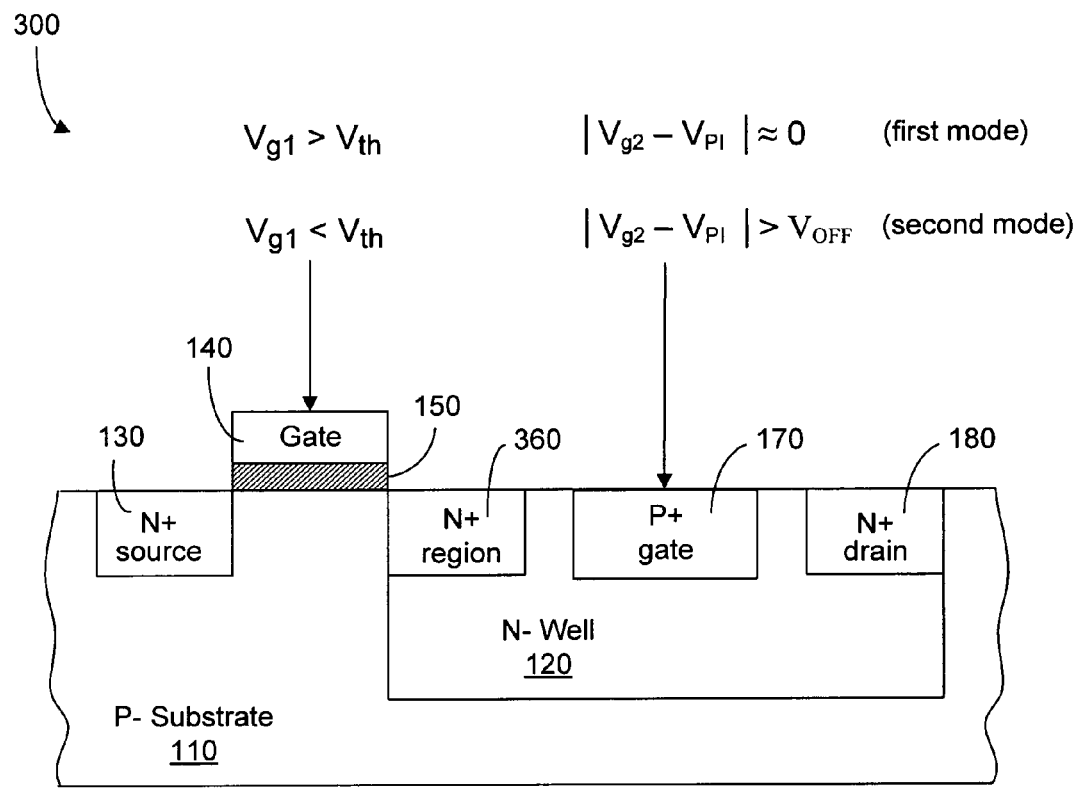
FIG. 3 illustrates an exemplary cross section of a double-gate semiconductor device a comprising a MOS gate and a junction gate and a single N+ region disposed between the MOS gate and the junction gate.

FIG. 3 illustrates an exemplary cross section of a double-gate semiconductor device comprising a MOS gate and a junction gate and a single N+ region disposed between the MOS gate and the junction gate. Double-gate semiconductor device 300 may be formed from regions and/or layers of doped silicon, polysilicon, metal, and insulating layers using semiconductor fabrication techniques known in the art. Double-gate semiconductor device 300 comprises P− substrate 110, a N− well 120 formed in the P− substrate 110, N+ source 130, gate 140, oxide layer 150, N+ region 360, P+ gate 170, and N+ drain 180. As illustrated in FIG. 3, N+ region 360 is disposed substantially in the N− well 120.

As described with reference to FIGS. 1-2, electrical signals, such as $V_{g1}$ and control voltage $V_{g2}$, may be coupled to gate 140 and P+ gate 170, respectively. Electrical signals may also be coupled to N+ source 130, N+ region 360 and N+ drain 180 using additional polysilicon layers (not shown) or metal layers (not shown) disposed on a surface of each of the N+ source 130, N+ region 360 and N+ drain 180 using semiconductor fabrication techniques known in the art.

Double-gate semiconductor device 300 includes an N-type MOS gate formed by P− substrate 110, gate 140, and oxide layer 150. The double-gate semiconductor device 300 also includes an N-channel JFET formed by P− substrate 110, N− well 120, N+ region 360, P+ gate 170 and N+ drain 180. In this embodiment, the N+ region 360 is a source of the N-channel JFET and abuts the N-type MOS gate, the N-type MOS gate comprising gate 140 and oxide layer 150.

The double-gate semiconductor device 300 may considered to operate analogously to the two modes as described herein with respect to FIGS. 1-2. A first mode is indicated by $V_{g1}>$a threshold voltage $V_{th}$ and $|V_{g2}-V_{PI}|\approx 0$, where $V_{PI}$ is a voltage at N+ region 360. In the first mode a voltage $V_{g1}$ is applied to gate 140 that is greater than $V_{th}$ so that the MOS gate is "on." A control voltage $V_{g2}$ is applied to P+ gate 170 so that the junction gate is biased with a low potential difference between control voltage $V_{g2}$ and a voltage $V_{PI}$ of the N+ region 360. The P+ gate 170 thus presents a low resistance, $R_{on}$, to the current flow. In the first mode, the semiconductor device 300 conducts a current between N+ source 130 and N+ drain 180. In the second mode, the semiconductor device 300 does not conduct the current.

When a control voltage $V_{g2}$ is applied to P+ gate 170 such that $|V_{g2}-V_{PI}|\approx 0$ (corresponding to the first mode), the channel is open and a current of majority carriers may flow between N+ region 360 and N+ drain 180. The P+ gate 170 (the junction gate) may, therefore, be considered as behaving equivalently to a variable resistor with a high effective resistance, $R_{off}$, that allows little or no current flow between N+ source 130 and N+ drain 180 when $|V_{g2}-V_{PI}|>V_{off}$, and a low effective resistance, $R_{on}$, allowing maximum current flow when $|V_{g2}-V_{PI}|\infty 0$.

As described with reference to FIGS. 1-2, the double-gate semiconductor device 300 may be considered a device with a double-gate in which the control voltage $V_{g2}$ at P+ gate 170, the junction gate, may be a function of the voltage $V_{g1}$ at gate 140. The MOS gate and the junction gate may both be dynamically biased in the "on" state or "off" state at the same time using a control circuitry described with reference to FIG. 5. The control circuitry may comprise a capacitor (not shown) configured to couple a RF signal from gate 140 to P+ gate 170, as described with reference to FIG. 1.

In the second mode of operation, the high effective resistance, $R_{off}$, allows the P+ gate 170 to sustain a high voltage and limits the voltage potential between gate 140 and N+ region 360 to less than the MOS gate breakdown voltage. Because the breakdown voltage of the double-gate semiconductor device 300 is the sum of the breakdown voltages of the MOS gate and the P+ gate 170, the intrinsically high breakdown voltage of the P+ gate 170 provides the high breakdown voltage of the double-gate semiconductor device 300.

Figure 4:
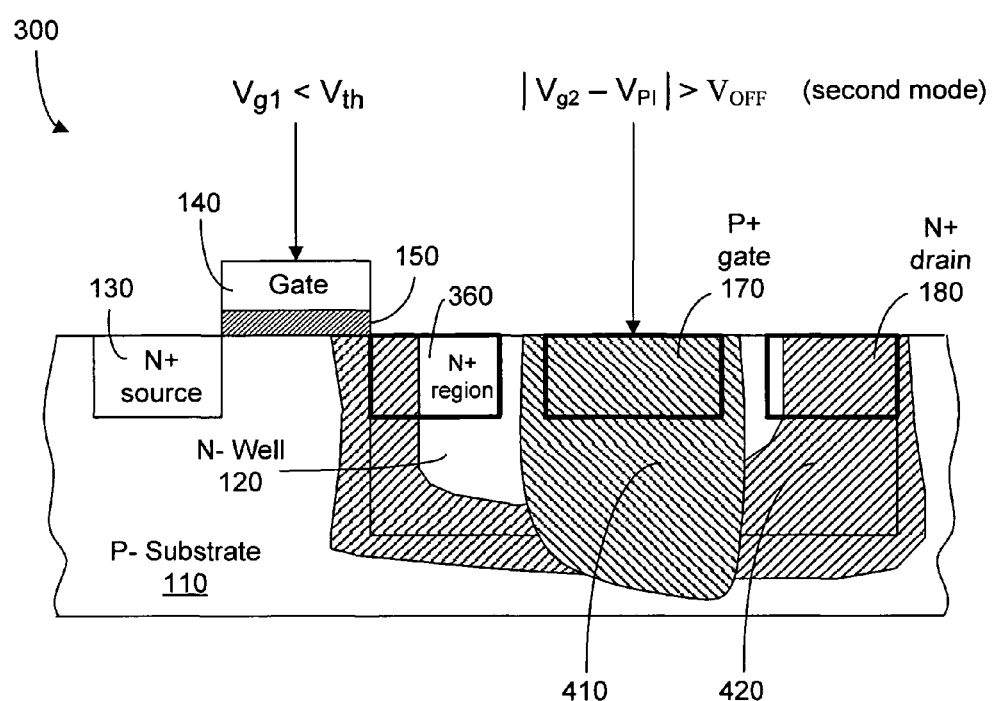
FIG. 4 illustrates an exemplary cross section of the double-gate semiconductor device of FIG. 3 in a second mode of operation.

FIG. 4 illustrates an exemplary cross section of the double-gate semiconductor device 300 of FIG. 3 in a second mode of operation. The description herein of the double gate semiconductor device 300 in a second mode of operation applies analogously to the second mode of operation of the double-gate semiconductor devices 100 and 200 described with reference to FIGS. 1-2, respectively.

In the second mode of operation, the voltage $V_{g1}$ applied to gate 140 is lower than the threshold voltage, $V_{th}$, so that the MOS gate is "off." A control voltage $V_{g2}$ is applied to the P+ gate 170 so that the junction gate is biased near the pinch-off voltage, $V_{off}$, by using a high potential difference between $V_{g2}$ and a voltage $V_{PI}$ of the N+ region 360. The P+ gate 170 thus presents a high effective resistance, $R_{off}$, to the current flow in a drift region, such as drift region 420 illustrated in FIG. 4. The high effective resistance, $R_{off}$, results from a depletion region extending under and around the P+ gate 170, such as depletion region 410 illustrated in FIG. 4.

The high effective resistance, $R_{off}$, in the second mode of operation allows the P+ gate 170 to sustain a high voltage and limits the voltage swing at gate 140 to less than the MOS gate breakdown voltage. The second mode of operation effectively protects the gate 140 from voltages greater than the breakdown voltage. Because the breakdown voltage of the double-gate semiconductor device 300 is the sum of the breakdown voltages of the MOS gate and the P+ gate 170, the intrinsically high breakdown voltage of the P+ gate 170 provides the high breakdown voltage of the double-gate semiconductor device 300.

Figure 5:
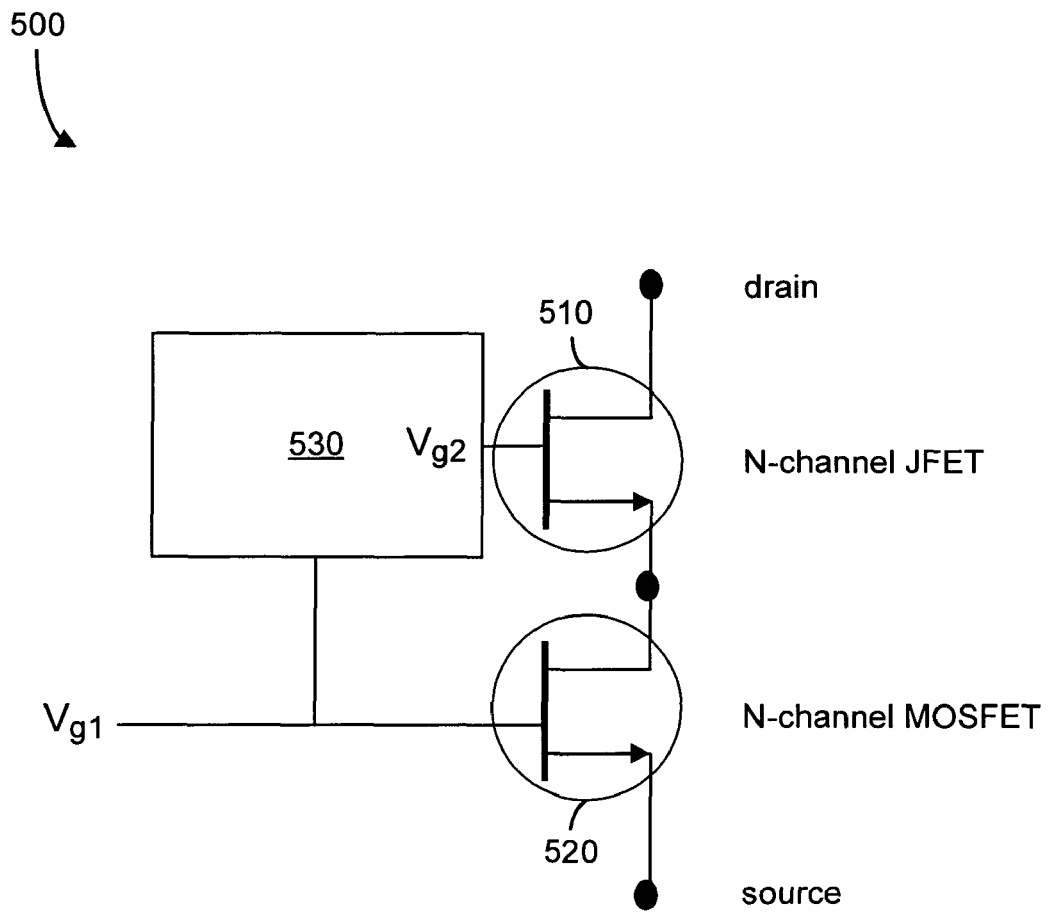
FIG. 5 illustrates an exemplary circuit diagram of the double-gate semiconductor devices of FIGS. 1-2.

FIG. 5 illustrates an exemplary circuit diagram of the double-gate semiconductor devices of FIGS. 1-2. The circuit 500 comprises N-channel JFET 510, N-channel MOSFET 520, and control circuitry 530. The control circuitry 530 provides a control voltage $V_{g2}$ to the gate of N-channel JFET 510 that may be a function of the voltage $V_{g1}$ of the N-channel MOSFET 520. The control circuitry 530 functions to dynamically bias both the N-channel MOSFET 520 and N-channel JFET 510 in the "on" state or the "off" state at the same time. Control circuitry 530 may be a capacitor that may couple a RF signal from the gate of the N-channel MOSFET to the gate of the N-channel JFET.

The control circuitry 530 provides the control voltage $V_{g2}$ to bias N-channel JFET 510 so that the $R_{off}$ effective resistance is a maximum value when the N-channel MOSFET is "off" (i.e., $V_{g1}<V_{th}$). Typically, the control voltage $V_{g2}$ biases N-channel JFET 510 close to the pinch-off voltage, $V_{off}$. When the N-channel MOSFET 520 is "on" (i.e., $V_{g1}>V_{th}$), then control circuitry 530 provides the control voltage $V_{g2}$ to bias N-channel JFET 510 so that the $R_{on}$ effective resistance is minimal and the current flow is a maximum. A large range of $R_{on}$ to $R_{off}$ effective resistance variation allows a large excursion of voltage at the drain of the N-channel JFET 510 and a corresponding high power capability for the double-gate semiconductor devices described with reference to FIGS. 1-2. The double-gate semiconductor devices described with reference to FIGS. 1-2 may also be represented by a circuit diagram similar to circuit 500 in which N-channel junction gate 510 may be substituted with a P-channel junction gate (not shown) and N-channel MOS gate 520 may be substituted with a P-channel MOS gate (not shown).

Figure 6:
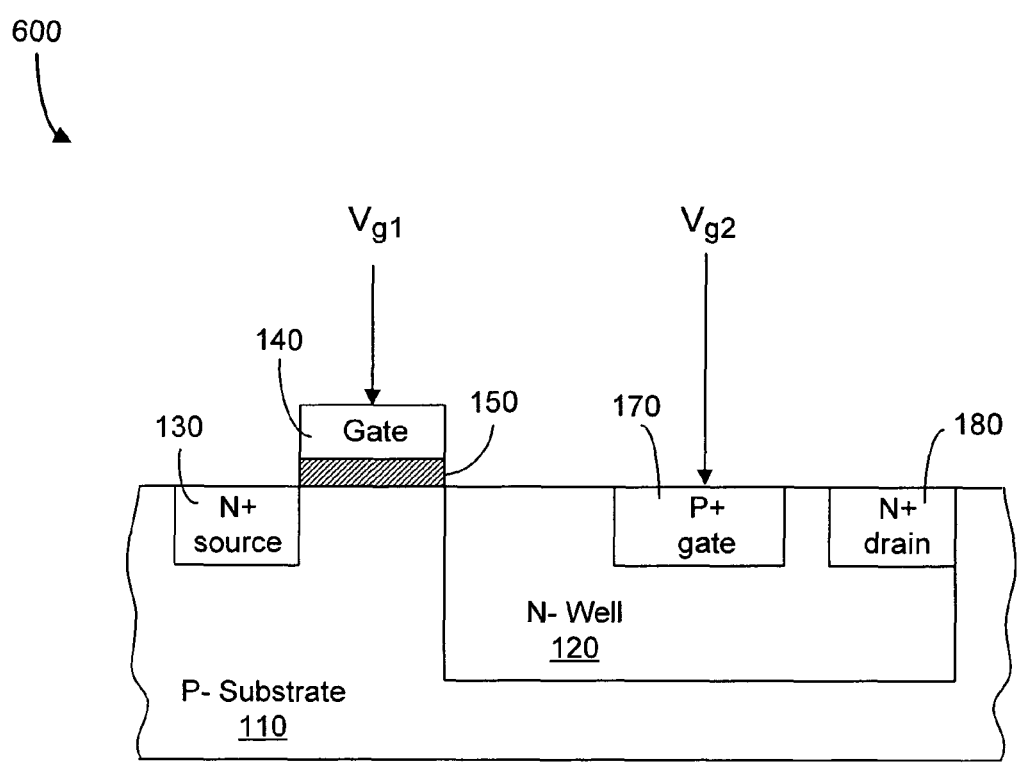
FIG. 6 illustrates an exemplary cross section of a double-gate semiconductor device comprising a MOS gate and a junction gate.

FIG. 6 illustrates a cross section of a double-gate semiconductor device, according to an alternative embodiment of the invention. In this embodiment, the double-gate semiconductor device 600 may be fabricated in a higher spatial density configuration than the embodiments described with reference to FIGS. 1-4. As illustrated in FIG. 6, double-gate semiconductor device 600 does not include a N+ region such as the N+ region 160, N+ region 162, N+ region 260, N+ region 262 and N+ region 360 described with reference to FIGS. 1-4. Thus, the double-gate semiconductor device 600 is fabricated without the common implantation of an N+ region between the MOS gate and the junction gate. The principle of operation of the double-gate semiconductor device 600 is analogous to the principles of operation of the double-gate semiconductor devices 100, 200 and 300 described with reference to FIGS. 1-3, including the description of the second mode of operation described with reference to FIG. 4.

Double-gate semiconductor device 600 may be formed from regions and/or layers of doped silicon, polysilicon, metal, and insulating layers using semiconductor fabrication techniques known in the art. The double-gate semiconductor device 600 comprises P− substrate 110, a N− well 120 formed in the P− substrate 110, N+ source 130, gate 140, oxide layer 150, P+ gate 170 and N+ drain 180.

Electrical signals, such as $V_{g1}$ and control voltage $V_{g2}$, may be coupled to gate 140, and P+ gate 170, respectively. Electrical signals may be coupled to N+ source 130 and N+ drain 180 using additional polysilicon layers (not shown) or metal layers (not shown) disposed on a surface of each of the N+ source 130 and N+ drain 180 using semiconductor fabrication techniques known in the art.

The double-gate semiconductor device 600 may be considered to operate analogously to the two modes of operation described with reference to FIGS. 1-4. In a first mode, a current conducts between N+ source 130 and N+ drain 180. In a second mode, the current does not conduct. In the first mode, a voltage $V_{g1}$ is applied to gate 140 that is greater than a threshold voltage $V_{th}$ (not shown). A control voltage $V_{g2}$ is applied to the P+ gate 170, thus presenting a low effective resistance, $R_{on}$, to the current flow.

In the second mode of operation, the voltage $V_{g1}$ applied to gate 140 is lower than a threshold voltage, $V_{th}$, and a control voltage $V_{g2}$ is applied P+ gate 170, thus presenting a high effective resistance, $R_{off}$, to the current flow. The high effective resistance, $R_{off}$, results from a depletion region, similar to the depletion region 410 described with reference to FIG. 4, that extends under and around P+ gate 170.

The embodiments discussed herein are illustrative of the present invention. As these embodiments are described with reference to illustrations, various modifications or adaptations of the methods or specific elements described may become apparent to those skilled in the art. All such modifications, adaptations, or variations that rely on the teachings of the present invention, and through which these teachings have advanced the art, are considered to be in the spirit and scope of the present invention. Hence, these descriptions and drawings should not be considered in a limiting sense, as it is understood that the present invention is in no way limited to only the embodiments illustrated.

What is claimed is:

1. A device comprising:
    a substrate;
    a source region defined within the substrate;
    a first gate including
        a dielectric layer disposed on the substrate and over a channel region defined within the substrate adjoining the source region, and
        an electrically conductive gate layer disposed on the dielectric layer;
    a well region defined within the substrate and including
        a drain region defined within the well region, and
        a second gate defined within the well region between the drain region and the first gate; and
    an electrically conductive path between the channel region and the well region, the electrically conductive path comprising a first doped region within the well, a second doped region outside of the well and adjoining the channel, and an electrically conductive layer disposed on the substrate and in contact with both of the first and second doped regions.

2. The device of claim 1 further comprising control circuitry coupled between the first gate and the second gate and configured to bias the second gate as a function of a bias applied to the first gate.

3. The device of claim 1 wherein the substrate comprises P doping, the source and drain regions both comprise N doping, the well comprises N doping, and the second gate comprises P doping.

4. The device of claim 2 wherein the control circuitry comprises a capacitor.

5. The device of claim 1 wherein the electrically conductive layer comprises polysilicon.

6. The device of claim 1 wherein the electrically conductive layer comprises a metal.

* * * * *